US009844159B1

(12) United States Patent
Liniger

(10) Patent No.: US 9,844,159 B1
(45) Date of Patent: Dec. 12, 2017

(54) HANDHELD MOUNT FOR PORTABLE ELECTRONIC DEVICES

(71) Applicant: Paul Stanley Liniger, Portland, OR (US)

(72) Inventor: Paul Stanley Liniger, Portland, OR (US)

(*) Notice: Subject to any disclaimer, the term of this patent is extended or adjusted under 35 U.S.C. 154(b) by 0 days.

(21) Appl. No.: 15/298,645

(22) Filed: Oct. 20, 2016

Related U.S. Application Data

(63) Continuation-in-part of application No. 14/261,201, filed on Apr. 24, 2014, now Pat. No. 9,483,075.

(51) Int. Cl.
| | |
|---|---|
| *H05K 7/00* | (2006.01) |
| *H05K 5/00* | (2006.01) |
| *H05K 5/02* | (2006.01) |
| *H02J 7/00* | (2006.01) |
| *G06F 1/16* | (2006.01) |

(52) U.S. Cl.
CPC .......... *H05K 5/023* (2013.01); *G06F 1/1613* (2013.01); *H02J 7/0052* (2013.01); *H02J 7/0063* (2013.01); *H05K 5/0017* (2013.01); *H05K 5/0086* (2013.01); *H05K 5/0217* (2013.01); *H02J 2007/0062* (2013.01)

(58) Field of Classification Search
CPC .......................................... H04N 5/225
USPC ................................... 361/679.33
See application file for complete search history.

(56) References Cited

U.S. PATENT DOCUMENTS

| | | | | |
|---|---|---|---|---|
| 3,020,017 A | * | 2/1962 | Watson ................ | A61G 13/12 248/205.8 |
| 6,773,110 B1 | * | 8/2004 | Gale .................... | F16M 13/04 348/211.4 |

* cited by examiner

*Primary Examiner* — Jerry Wu
(74) *Attorney, Agent, or Firm* — Mark S Hubert

(57) ABSTRACT

A handheld mount assembly for portable electronic device includes a pistol style grip and suction cup assembly. The mount assembly functions as a gripping device for handheld use, a hands free stand, and a recharging station. The mount can be secured anywhere on the back of the electronic device, making the angle adjustable for stand use, and also allowing the user to position the device differently to accommodate his/her own needs. The mount can power/charge the portable wireless device as well as wirelessly connect to it and integrate its operational controls to those three tactile controls of the mount assembly.

16 Claims, 6 Drawing Sheets

FIG. 5
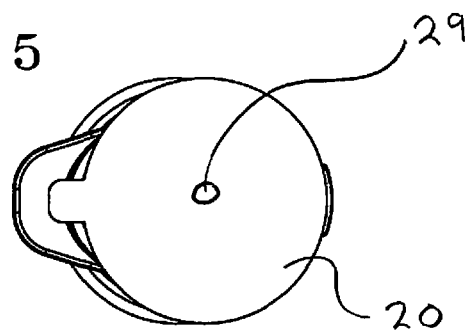
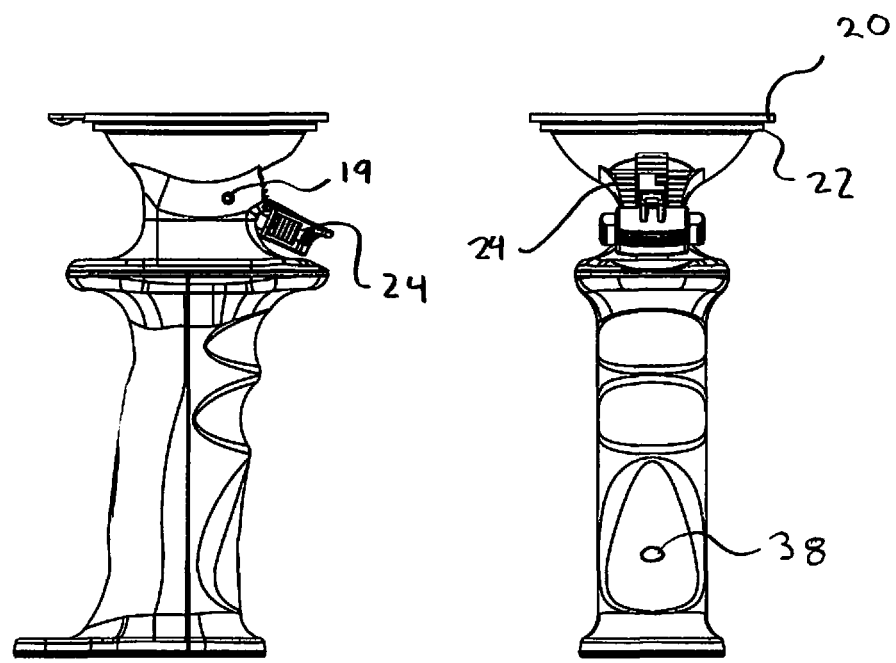
FIG. 6      FIG. 7

HANDHELD MOUNT FOR PORTABLE ELECTRONIC DEVICES

CLAIM FOR DOMESTIC PRIORITY

This application is a continuation-in-part, incorporates in its entirety, and claims the benefit of pending U.S. Utility patent application Ser. No. 14/261,201 filed Apr. 24, 2014.

BACKGROUND OF THE INVENTION

Numerous ways of mounting tablet/pad computers and smart phone devices such as: the Samsung Galaxy® product line, Iphones®, Ipads®, Ipods®, Kindles®, similar e-book readers, and similar portable electronic/multi-media devices are well know. However, several limitations exist for known mounts. Often it is impossible to alter the orientation of the device (that is go from portrait to landscape or landscape to portrait) for ease of viewing, are cumbersome, and the attachment point of the mount is fixed typically in the center of the portable multi-media device. Additionally, mounts that are designed as "handheld" will not double as a "hands free" stand.

Additionally, with the prior art existing mounts, both of the user's hands are employed. One hand has to hold the mount and the other hand must be free to operate the controls of the portable electronic/multi-media device. This limits the use to those who do not have disabilities in either arm. This dual arm operation of the portable electronic/multi-media devices if performed too aggressively, may accidentally jar it from the mount with disastrous results.

SUMMARY OF THE INVENTION

The handheld mount assembly of the present invention is an ergonomic convenience aid for easily holding, standing, positioning, and handling portable electronic devices, as well as any light household items with flat smooth mounting surfaces. The assembly includes rechargeable batteries and can charge/power the electronic devices it is designed to hold. Further, it operationally, wirelessly connects to the portable electronic/multi-media device and transfers the operational control functions of the portable electronic/multi-media device down to an ergonomic set of tactile controls incorporated into the the handheld mount assembly so that one hand operation of the portable electronic/multi-media device is possible.

The mount assembly also doubles as a stand for hands free use, and provides different angles by simply rotating the electronic device it is attached to. The handheld mount assembly can also be easily positioned in different places on an object to support even more creative sustained use; for example, offsetting the mount's connection point to balance part of the device on the user's arm while drawing or writing with a stylus. A pistol style grip on the handheld mount assembly allows for longer and more comfortable use while lying in bed, reading, or watching movies. It reduces the strain on hands and wrists by allowing the use of larger muscle groups. The handheld mount assembly design also supports a more stable application for lap viewing or reading—the user does not even need to hold the mount assembly, as the mount assembly acts as a counter balance contacting the user's leg or stomach, while the user holds the multi-media device (or even laptop) to which the mount is attached. The handheld mount assembly of the present invention also allows for simplified transport of multi-media devices from one room to another and will function as a hands free stand on soft and hard surfaces, and since the handheld mount assembly of the present invention can be secured at any point on the back of the multi-media device the angle at which the devices rests (or stands) on a surface is adjustable.

Finally, the assembly includes a recessed ¼" thread both on its top and bottom surfaces to accommodate a standardized mounting bolt such as can be found on camers, tripods, video recorders, electronic survey equipment and a plethora of other portable electronic/multi-media devices. Basically, users can attach anything with a ¼" bolt above or below the device—for example, a pivotal suction cup mount.

BRIEF DESCRIPTION OF THE DRAWINGS

FIG. 5 is a top view of the handheld mount assembly;

FIG. 6 is a right-side view of the handheld mount assembly;

FIG. 7 is a rear view of the handheld mount assembly;

DETAILED DESCRIPTION

Figure 1:
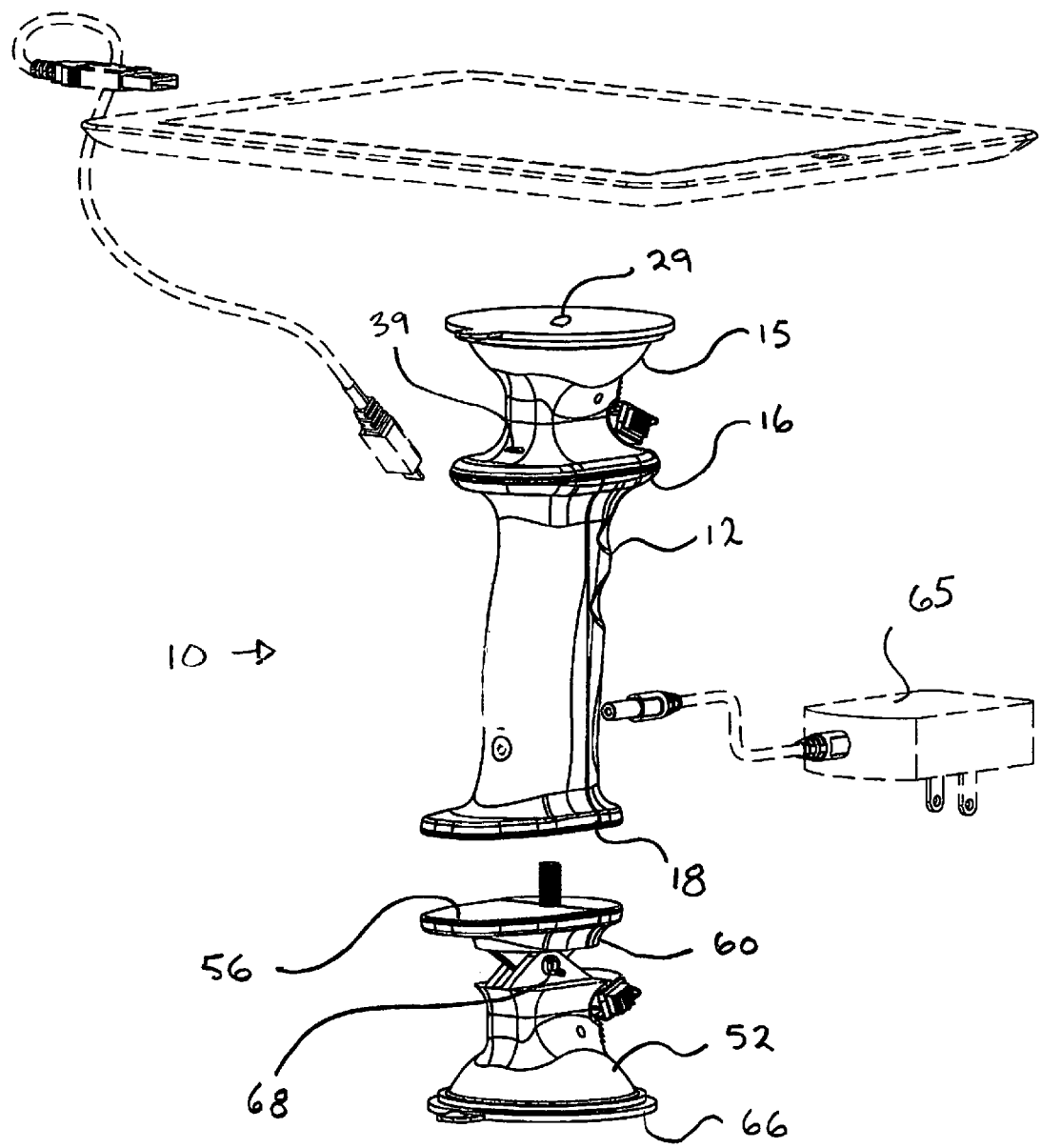
FIG. 1 is an exploded perspective view of handheld mount assembly of the present invention illustrating an optional bottom suction mount, a wall charger attachment and a portable electronic device.
Figure 10:
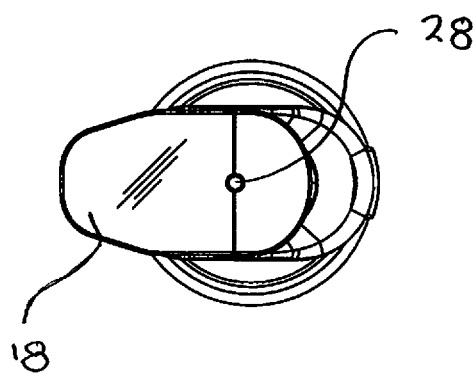
FIG. 10 is a bottom view of the handheld mount assembly.

Looking at FIG. 1 we can best begin the description of the physical structure of the device. It can be seen that the handheld mount assembly 10 includes a pistol grip assembly 12 that accommodates a user's hand in a first configuration. Grip assembly 12 accommodates both left and right-hand gripping with ergonomically correct finger grooves 14, (FIGS. 3, 6, 7 and 9) a rear upper extension 16 for supporting the web of the hand, and a flat base 18. Visible in FIG. 10 is its lower connection orifice 28, which is a recessed ¼" by 20 coarse thread and designed to accommodate a standard tripod mount as is well known in the art. Similarly, an upper connection orifice 29 can be seen in FIGS. 1, 3 and 5. The upper connection orifice 29 is also a ¼-20 thread which is standardized in the related portable multi-media electronic devices is utilized on a plethora of devices.

Figure 2:
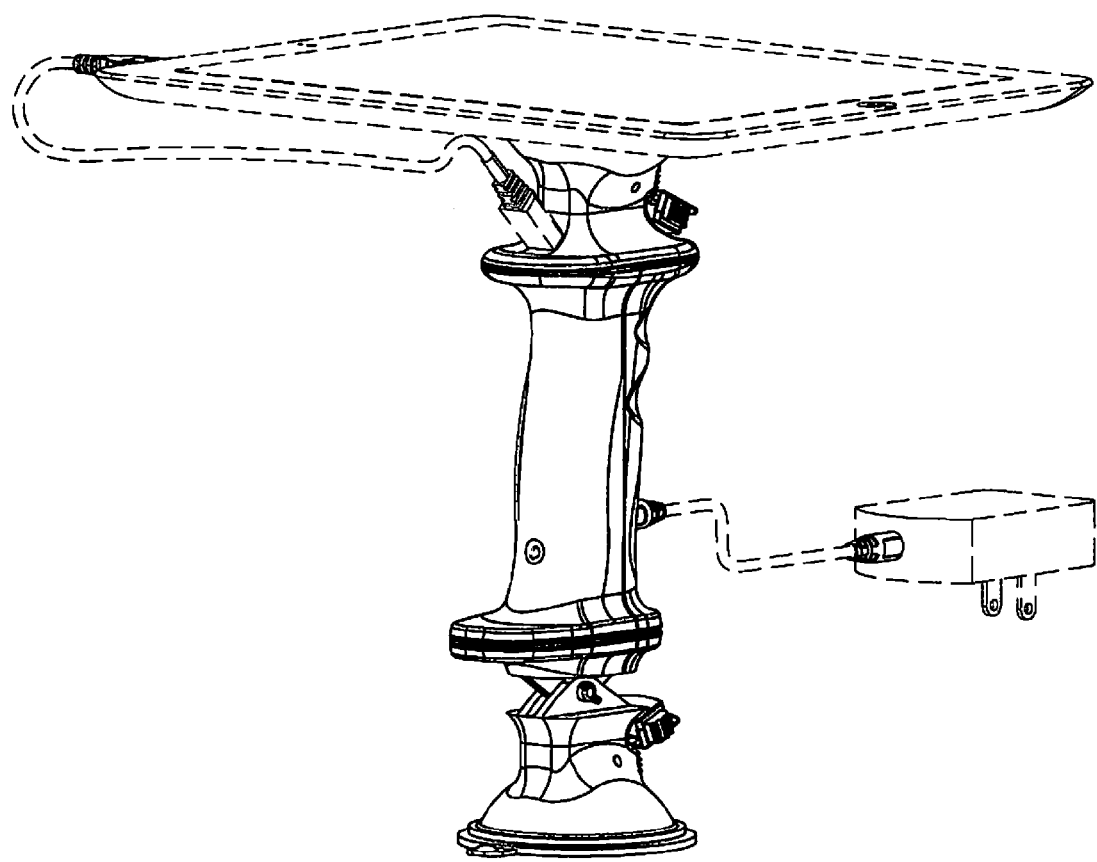
FIG. 2 is a perspective view of the handheld mount assembly of FIG. 1 connected to a wall charger and a portable electronic device for charging.

Grip assembly 12 is mechanically conjoined to lock section 15. Should a user need or want to access the interior electrical components of grip assembly 12, he or she would simply undo the mechanical connection between the lock section 25 and the grip section 12 (which in the preferred embodiment would be threaded connectors) and then segregate the grip section 12 into is two outer shell components. Electrical terminal 38 is visible in FIGS. 3 and 7 and provides for secure connection to a electrical charging source 65 as illustrated in FIGS. 1 and 2. Although direct electrical charging of the battery is used in the preferred embodiment, it is known that inductive (wireless) charging would be an equivalent method of charging as is well known in the art.

Figure 4:
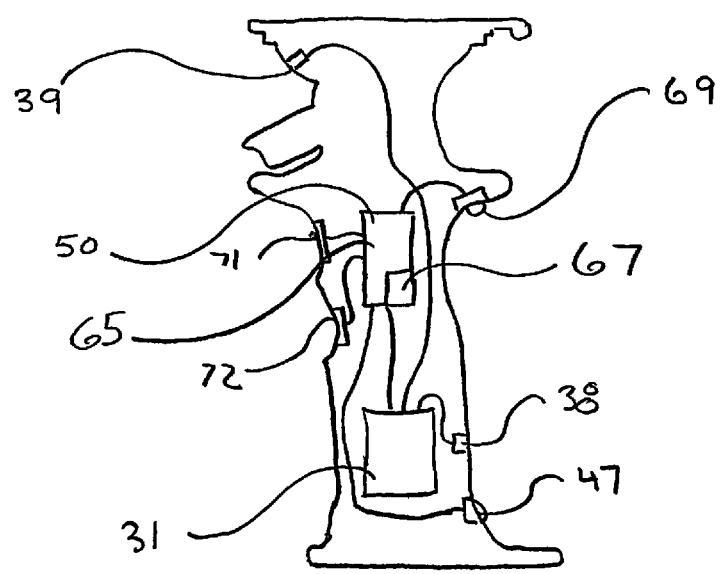
FIG. 4 is a representative view of the internal components of the handheld mount assembly.
Figures 8, 9:
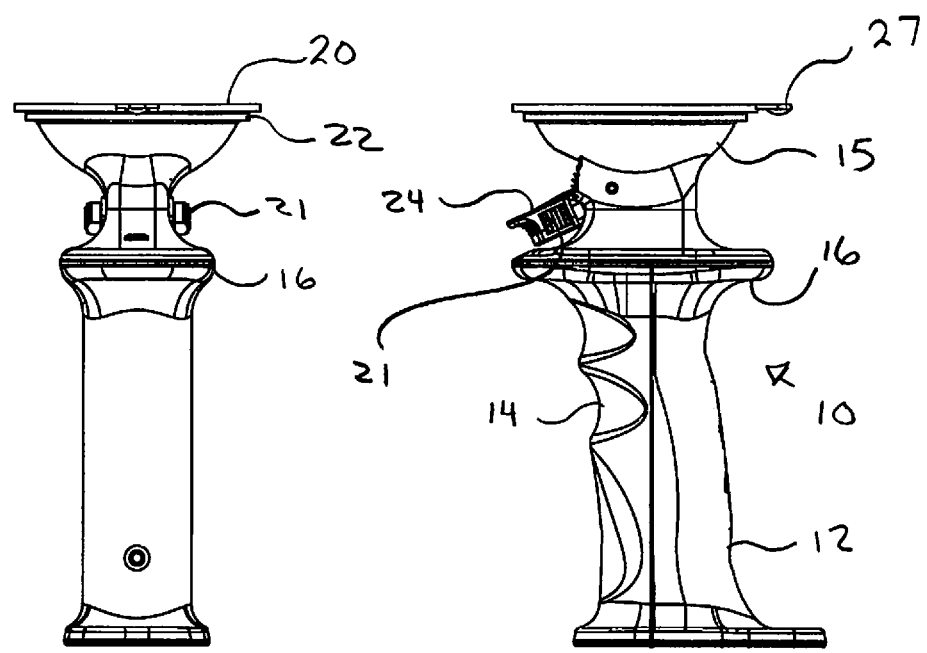
FIG. 8 is a front view the handheld mount assembly.
FIG. 9 is a left-side view of the handheld mount assembly.

Internally, grip assembly 12 includes at least one battery 31 housed therein, as is illustrated in FIG. 4. The battery 31 will have sufficient power to power the device's microprocessor 50 as well as any attached or any peripheral add-ons such as a phone, computer tablet or the like. In this way, the battery can serve as a reserve power for other devices. Second electrical terminal 39 is visible in FIGS. 1 and 4, and allows an electronic device to be connected to mount 10 via an appropriate electronic connector as illustrated in FIGS. 1-2. (Preferably this is be a USB port style connector.) Since the grip assembly 12 is assembled in two shell components, replacement of the battery 31 or access to the other internal components can be accessed by segregation of the two portions as disclosed above. It is also known that in an alternate embodiment there may be a direct access hatch to the battery incorporated into the grip assembly 12.

Looking at FIGS. 6, 7, 8 and 9 it can be seen that above and extending therefrom rear upper extension 16 is the lock section 15 which comprises domed base 22, lever 24, flexible polymer suction cup disk 20, ratchet locking mechanism 80 and pivot pin 19. Lock section 15 is capable of securing to any planar, smooth surface such as the back of multimedia devices as illustrated in FIGS. 1 and 2, or in an alternate use, could be secured to the back of dinner plate or server's tray to provide an alternate and more ergonomic method of caring serving plates and trays, or even hard surface construction material such as laminate, plastic, and glass, to aid in installation. The vacuum grip provided by the lock section 15 is well know in the industry, but generally, the flexible polymer suction cup disc 20 is positioned on the back of the device that is to be secured/mounted. Lever 24 has an arm that serves as a fulcrum about a pivot pin 19 as is connected at its distal end to the bottom face of the center of disk 20. The lever 24 pivots about pivot pin 19, such that when it is vertically raised the end of the arm connected to the bottom face of disk 20 is drawn downward so as to cause the upper face of disk 20 to form a concave depression, forming the vacuum seal discussed above.

A ratchet locking mechanism is mechanically situated between lever 24 and domed base 22 and utilizes ratchet-lock teeth to lockingly engage at various different degrees of concave deflection of the disk 20. On lever 24 is at least one release button 21 (FIGS. 8 and 9) that mechanically disengages lever 24 from its associated teeth. The ratchet lock device allows the vertical position of the lever 24 to be secured corresponding to different degrees of concavity achieved on the upper face of flexible disk 26. In this manner the strength the vacuum may be adjusted for vary weights, creating an adjustable vacuum grip (stronger or lighter suction grip) depending on need. Additionally, the flexible polymer of the present invention does not require the surface (back of the multi-media device, for example) to be initially moistened. A small tab 27 of disk 20 (FIG. 9) extends beyond domed base 22 allowing the user to break the vacuum seal. Lock section 15 is mechanically affixed to grip assembly 12 at their respective mating physical interfaces.

Figure 3:
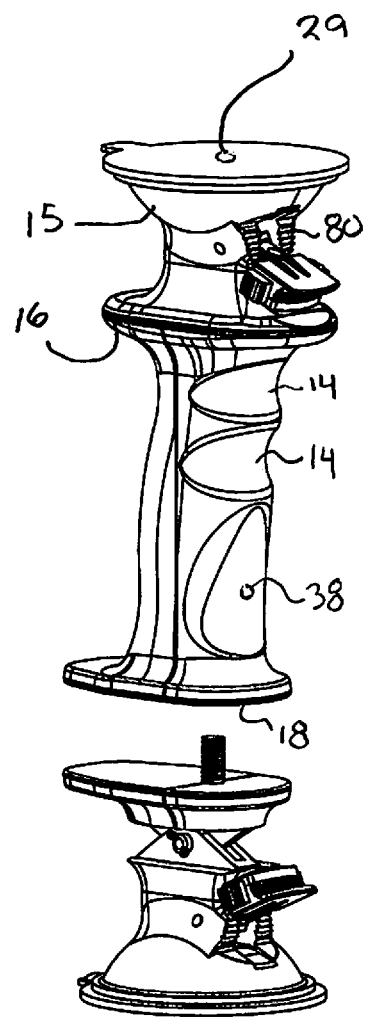
FIG. 3 is an exploded rear perspective view of the handheld mount assembly with the optional bottom suction mount.

Turning to FIGS. 1-3, the handheld mount assembly 10 can be seen coupled at its lower connection orifice 29 to pivotal suction cup mount 52. Suction cup mount 52 is substantially similar in design and function to that of lock section 15 but additionally has a first pivotal connection member 60 extending pivotally therefrom. The first pivotal connection member 60 has a mounting plate 56 with a ¼-20 threaded connecter extending therefrom. It is pivotally connected to the suction cup mount 52 from its lower face with a pivot pin 68 connecting these two components. This will allow pivotal motion of the suction cup 66 with respect to grip assembly 12, when suction cup mount 52 is threadingly engaged to lower connection orifice 28. The suction cup mount 52 is just an example of any number of pivotal or stationary mounts that could be attached to mount assembly 10. For example, mounting plate 56 could be configured to house a ball head making mount assembly 10 pivotal about the ball head.

The internals of the preferred embodiment of the handheld mount assembly for portable electronic devices 10 is best explained looking at FIG. 4. Internally housed within the pistol grip assembly 12 is a battery 31 connectable to a charging power source 65 (FIG. 1) through electrical terminal 38. There is a microprocessor 65 with a wireless Bluetooth™ transceiver 67 (or an equivalent wireless transmission/reception source). The wireless transceiver is operably connected to the battery 31, an on/off switch 47, and three tactile controls (a tactile roller ball unit 69, a first depressible tactile button 71 and a second depressible tactile button 72). The on/off switch 47 and the three tactile controls extend from the surface of the pistol grip assembly 12. The battery 31 is also operably connected to the second electrical terminal 39 as discussed herein. Although it is well known in the art that the number and style of tactile controls may vary. This is especially true with the advent of many of the new style "smart" buttons, that can alternate between multiple functions based on the number of depression utilized and the timing thereof the depressions.

The microprocessor 65, when powered from the battery 31 initiates a protocol for wireless electronic pairing signal with nearby electronic devices. (The device coupled to the disk 20 being the intended recipient.) The coupled device will display the standard device pairing protocol on its display panel prompting the user to complete the required manual pairing steps. (Often this is the inputting of pairing codes or acknowledgement of permission to pair the devices.) Once this is completed the handheld mount assembly 10 and the device are in wireless communication. The microprocessor 65 has a specific algorithmic program that has been imbedded in its memory that transfers the tactile control of the coupled device to the handheld mount assembly 10. Directional curser movement on the coupled device is now controlled by the tactile roller ball unit 69. As the roller ball is moved, the curser on the coupled device is similarly moved. Similarly, the selection button of the coupled device relegates is operation to that of the first depressible tactile button 71. Similarly the keypad alphanumeric selection feature of the coupled device relegates its operation to that of the roller ball and the second depressible tactile button 72. In this manner, with but three tactile controls on the handheld mount assembly 10, all selection features of the coupled devices may be accomplished. Such type of three button operational control transfer is well known in the field and is commonly used in Apple™ and other computerized devices.

The electronic pairing and takeover of the operational control of the coupled device may be accomplished by the algorithmic program on the microprocessor (for select coupled units) or by a downloadable application that is loaded onto the coupled device's memory and operating system. Generally, this will be by the direct wi-fi download of an application from the internet/cloud to the device that is specifically tailored for the coupling of that device to the handheld mount assembly 10.

To use the lock section 15 of the handheld mount assembly for portable electronic devices 10 is pressed against the planar, flat surface of the back (non-viewing side) of a portable multi-media device, and the lever 24 actuated, tightening the flexible polymer disk 20 and securing mount 10 via a vacuum grip. Once secured, the user is free to hold or carry his multi-media device via the mount assembly 10.

In operation, the handheld mount assembly for portable electronic devices 10 is mechanically coupled to the device of choice by the lock section's suction cup disk 20. The mount assembly 10 is then switched on by the on/off switch 47. The software programs on the microprocessor 65 send forth a wireless pairing signal to the connected device. After the protocol electronic pairing "handshake" has been completed between the coupled device and the mount assembly 10, the microprocessor assumes control of the operational control in the coupled device either by direct integration with of the coupled device's control system or by indirect integration through an device specific application that has been downloaded into the coupled device. Now all operation of the coupled device may be accomplished through the three tactile controls 69, 71 and 72 located on the grip assembly 12 of the mount 10.

Although specific embodiments have been illustrated and described herein, it will be appreciated by those of ordinary skill in the art that a wide variety of alternate and/or equivalent implementations calculated to achieve the same purposes may be substituted for the specific embodiments shown and described without departing from the scope of the present invention. Therefore, it is intended that this invention be limited only by the claims and the equivalents thereof.

I claim:

1. A handheld mount for the retention of a portable electronic device, comprising:
    a pistol grip assembly, wherein said pistol grip assembly comprises a flat base, finger groves, and a rear upper extension; a lock section affixed to said pistol grip assembly, said lock section with a suction cup disk extending from said rear upper extension and adapted for secure an attachment with a smooth planar surface of said personal electronic device, and wherein a pivotal suction cup disk is mechanically affixed to said flat base of said pistol grip assembly; a rechargeable battery housed within said pistol grip assembly;
    at least one tactile control extending from an outer surface of said pistol grip assembly;
    a microprocessor operatively connected to said tactile control and said rechargeable battery, said microprocessor having a wireless transceiver thereon and housed therein said pistol grip assembly; and an on/off switch extending from said pistol grip assembly and in operational contact with said microprocessor;
    wherein a stand assembly is adapted for wireless communication with said portable electronic device.

2. The handheld mount of claim 1 wherein said lock section comprises:
    a lever with a distal end,
    a domed base having a top face and a bottom face, said bottom face affixed to said distal end,
    a flexible polymer suction cup disk affixed to a top face of said domed base,
    a pivot pin affixed to said lever, said pivot pin allowing the pivotal motion of said lever to move said domed base vertically.

3. The handheld mount of claim 2 further comprising a USB power outlet capable of providing a source of power to said portable electronic devices and at least one electronic connector for operable connection to a battery charging source.

4. The handheld mount of claim 2 further comprising a threaded orifice formed in said lock assembly through said suction cup disk and said domed base for the threaded connection of external portable electronic devices.

5. The handheld mount of claim 2 wherein said lever is mechanically connected to said suction cup disk such that when said lever is vertically raised a bottom face of said suction cup disk is drawn downward so as to cause an upper face of said suction cup disk to form a concave depression.

6. The handheld mount of claim 5 wherein said suction cup disk includes a small tab of flexible polymer extending therefrom.

7. The handheld mount of claim 2 wherein said suction cup assembly further comprises a ratchet locking mechanism mechanically situated between said lever and said domed base;
    wherein said ratchet locking mechanism utilizes ratchet-lock teeth and mechanically engages said ratchet-lock teeth, allowing the vertical position of the said lever to be altered.

8. The handheld mount of claim 7 wherein said lever further includes a button for mechanical disengagement of said lever from said ratchet-lock teeth.

9. The handled mount of claim 1 wherein said flat base further includes a recessed connection threaded orifice therein.

10. The handheld mount of claim 1 wherein said microprocessor has an algorithmic program that is capable of electronically pairing said portable electronic device to said handheld mount for wireless communication so as to allow said handheld mount to operationally control a coupled portable electronic device.

11. The handheld mount of claim 10 wherein the number of said tactile controls is three.

12. The handheld mount of claim 11 wherein said three tactile controls are a roller ball unit, a first depressible tactile button and a second depressible tactile button.

13. The handheld mount of claim 12 wherein said microprocessor has an algorithmic program in a memory that transfers the tactile control of said coupled device to said handheld mount.

14. The handheld mount of claim 13 wherein a directional curser movement of the coupled device is controllable by the tactile roller ball unit 69, such that a roller ball of said roller ball unit is moved, said curser on the coupled device is similarly moved.

15. The handheld mount of claim 14 wherein a selection button of said coupled device is controllable by said first depressible tactile button.

16. The handheld mount of claim 15 wherein an keypad alpha-numeric selection feature of said coupled device is controllable by said second depressible tactile button.

* * * * *